(12) United States Patent
Carroll et al.

(10) Patent No.: US 6,359,317 B1
(45) Date of Patent: Mar. 19, 2002

(54) VERTICAL PNP BIPOLAR TRANSISTOR AND ITS METHOD OF FABRICATION

(75) Inventors: Michael S. Carroll; Yih-Feng Chyan; Samir Chaudhry; Tony G. Ivanov; Robert W. Dail, all of Orlando; Alan S. Chen, Windermere, all of FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/222,587

(22) Filed: Dec. 28, 1998

(51) Int. Cl.[7] .......................... H01L 29/76; H01L 29/94
(52) U.S. Cl. ........................ 257/370; 257/378
(58) Field of Search ................................ 257/370, 378

(56) References Cited

U.S. PATENT DOCUMENTS 5,581,112 A * 12/1996 Li et al.
5,677,209 A  10/1997 Shon et al.

OTHER PUBLICATIONS

"Process HJ: A 30 GHz NPN and 20 GHz PNP Complementary Bipolar Process for High Linearity RF Circuits." M. C. Wilson et al. Proc. IEEE 1998 BCTM 9.4, pp. 164–167.

"A Complementary Bipolar Technology for Low Cost and High Performance Mixed Analog/Digital Applications", H. Miwa et al., Proc. IEEE 1996 BCTM 11.4, pp. 185–188.

* cited by examiner

Primary Examiner—Stephen D. Meier

(57) ABSTRACT

A bipolar vertical PNP transistor compatible with CMOS processing and useful in a complementary BiMOS structure is characterized in that it is devoid of an epitaxial layer and employs a high-energy implanted phosphorus layer to provide N-type substrate isolation.

6 Claims, 13 Drawing Sheets

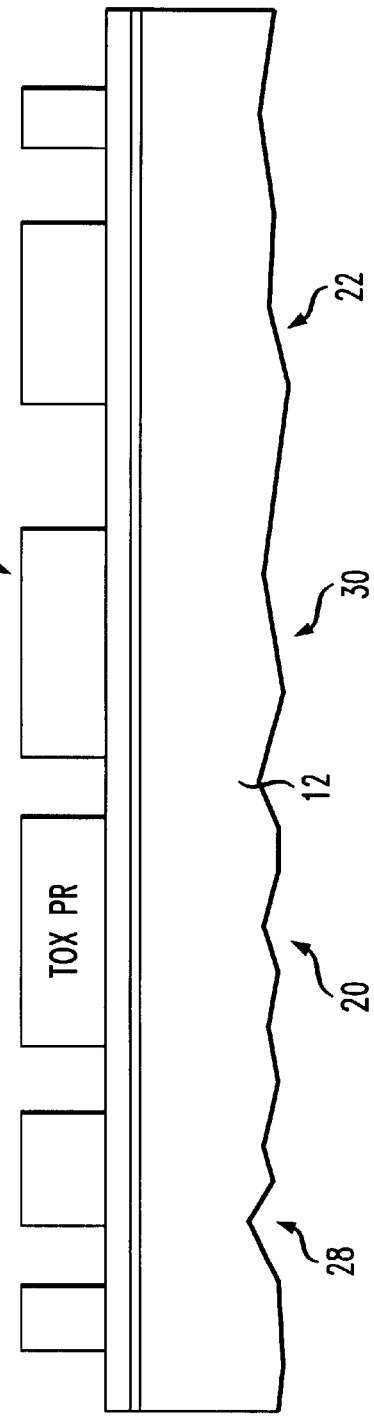
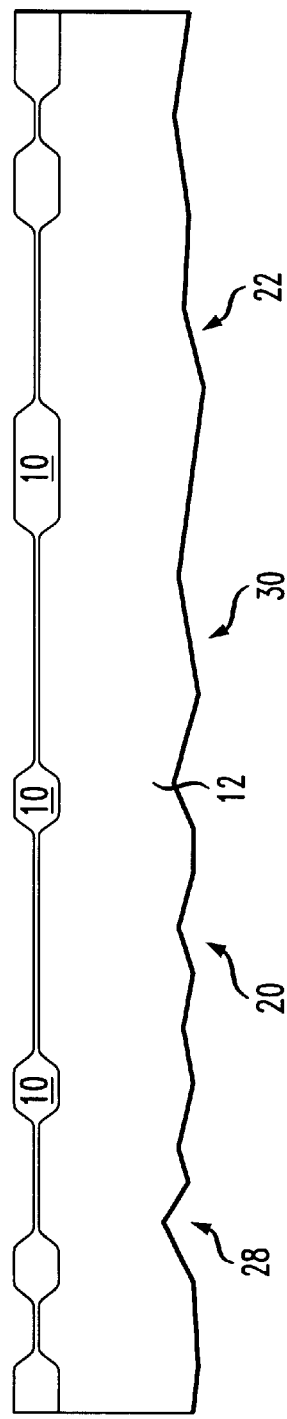

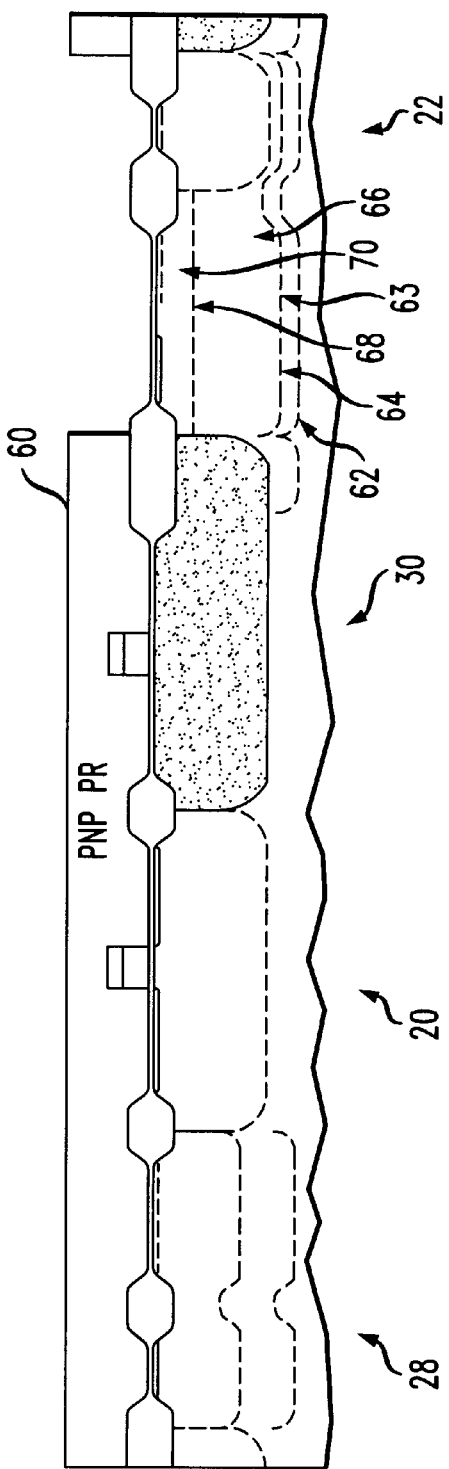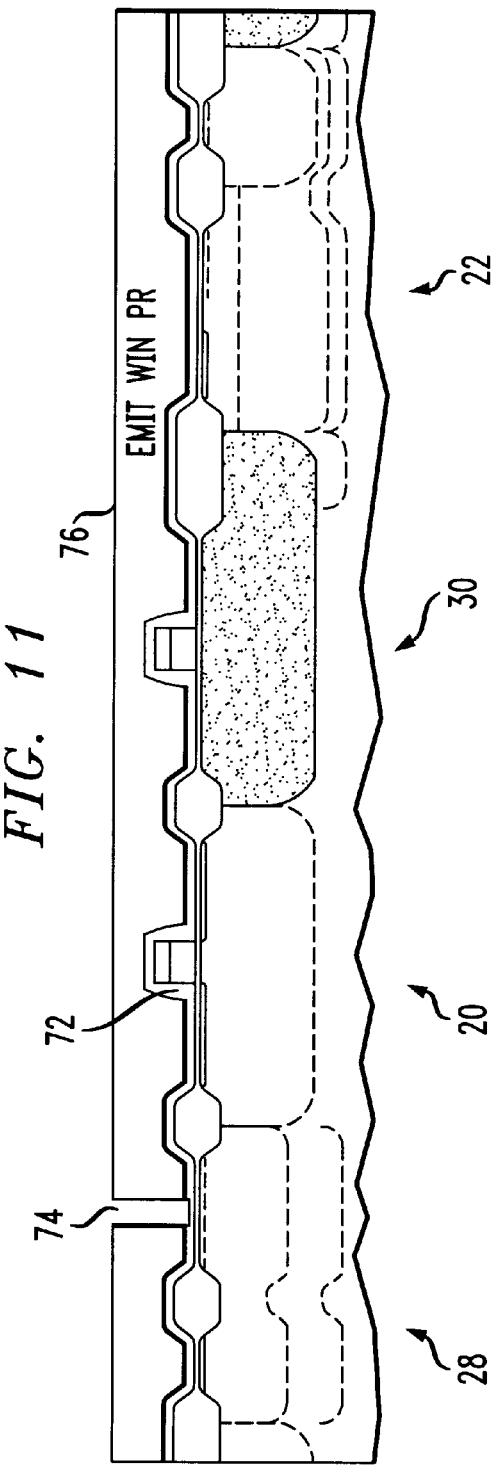

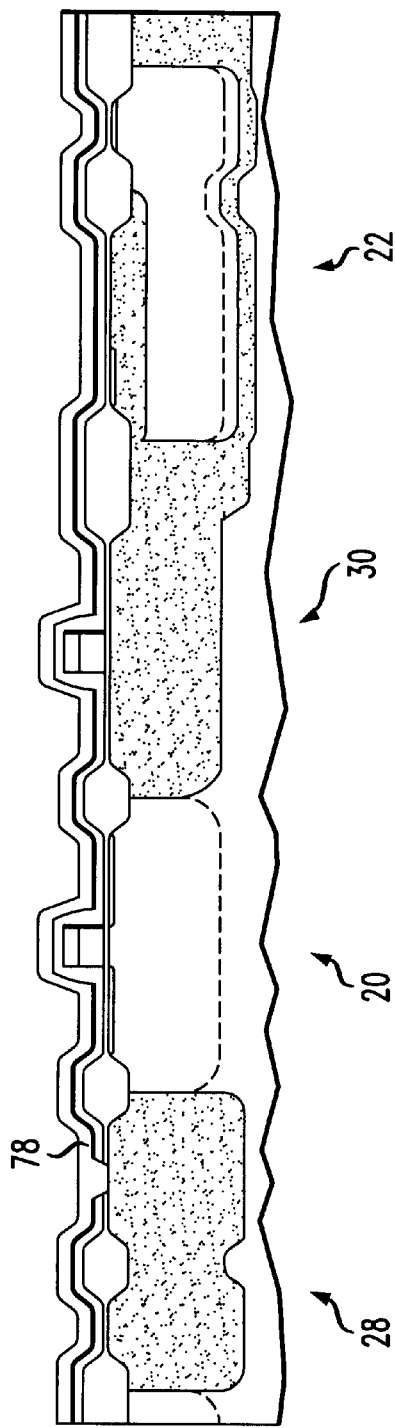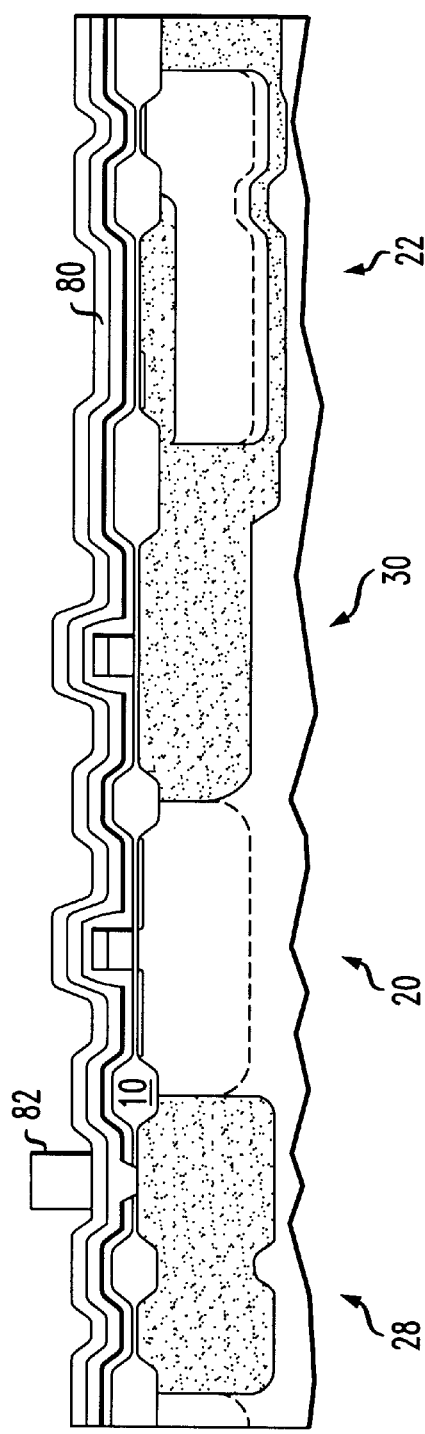

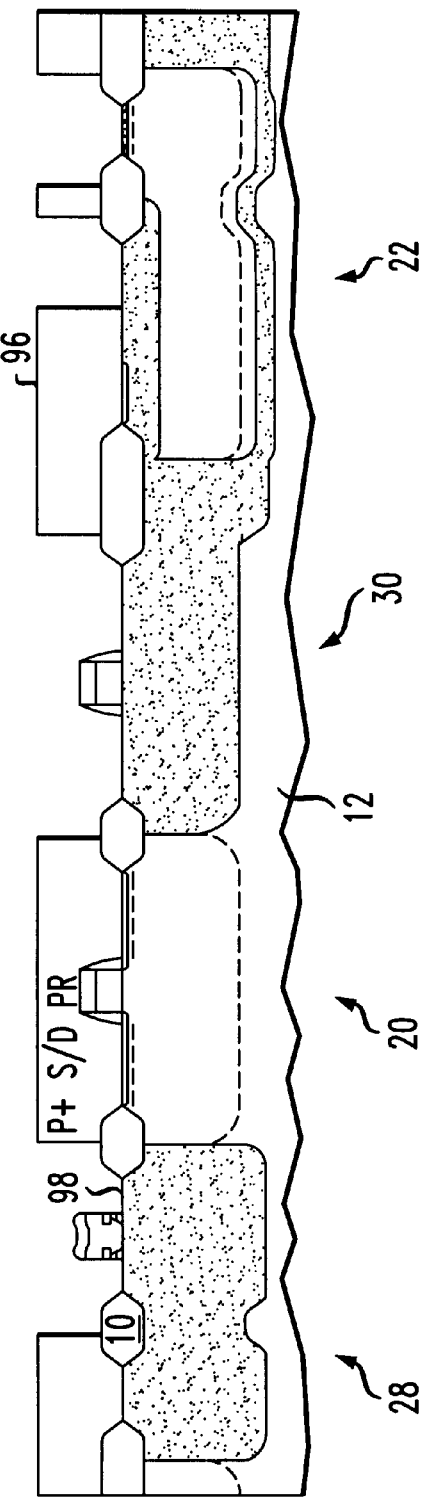
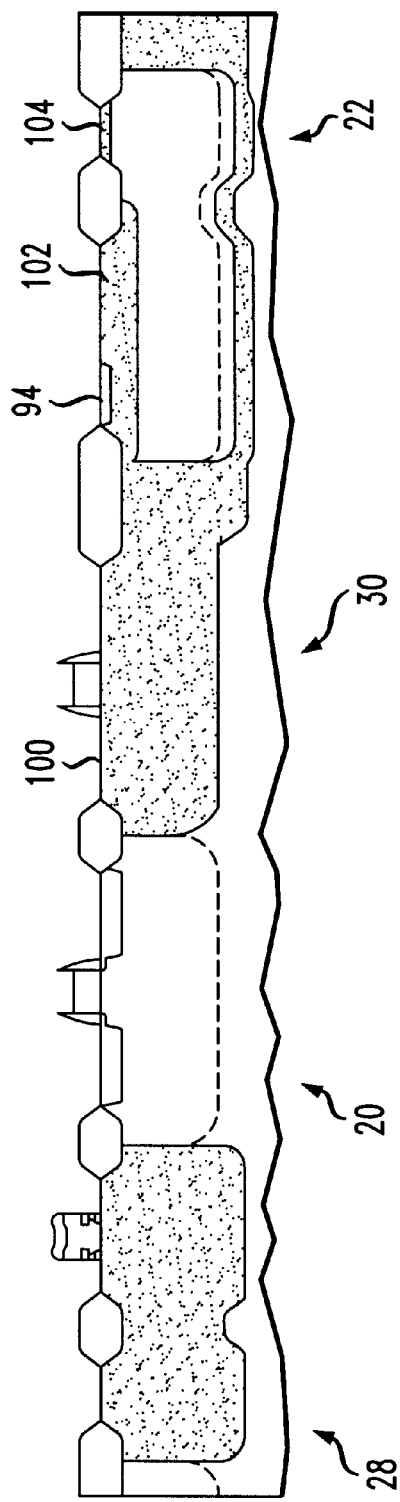

FIG. 18

VARIATION OF ELECTRICAL PARAMETERS FOR HEICBiC PROCESS

| PARAMETER | UNIT | AVE VALUE | 3σ VARIATION* |
|---|---|---|---|
| EMITTER SIZE | $\mu m^2$ | 0.8 x 2.4 | --- |
| CURRENT GAIN (Hfe OR Beta) | | 40 | 8 |
| BVceo | V | 6.5 | 0.3 |
| BVcs | V | 7.5 | 0.3 |
| Va | V | 10.2 | 2 |
| $F_T$ | GHz | 11 | 1.5 |
| Re | Ω | 23 | 5 |
| Rb | Ω | 380 | 75 |
| Rc | Ω | 450 | 50 |
| Cje | fF | 5 | 0.5 |
| Cjc | fF | 22 | 4 |
| Cjs | fF | 42 | 6 |

* ENGINEERING ESTIMATES

FIG. 19

COMPARISON OF HEICBiC PROCESS WITH OTHER COMPLEMENTARY BIPOLAR/BiCMOS PROCESSES

| PARAMETER | UNIT | 0.25HEICBiC (LUCENT) | SONY BIPOLAR PROCESS[1] | PROCESS HJ (MITEL SEMI.)[2] |
|---|---|---|---|---|
| EMITTER SIZE | $\mu m^2$ | 0.8 x 2.4 | 2.0 x 4.8 | 0.6 X 3.0 |
| CURRENT GAIN (Hfe OR Beta) | | 40 | 100 | 50 |
| BVceo | V | 6.5 | 4 | 4.5 |
| BVcs | V | 7.5 | 12 | 9 |
| Va | V | 10.2 | 7 | 33 |
| $F_T$ | GHz | 11 | 4 | 20 |
| Re | Ω | 23 | ? | 18 |
| Rb | Ω | 380 | ? | 400 |
| Rc | Ω | 450 | ? | 320 |
| Cje | fF | 5 | ? | 10 |
| Cjc | fF | 22 | ? | 9 |
| Cjs | fF | 42 | ? | 20 |

[1] "A COMPLEMENTARY BIPOLAR TECHNOLOGY FOR LOW COST AND HIGH PERFORMANCE MIXED ANALOG/DIGITAL APPLICATIONS," H. MIWA, H. AMMO, H. EJIRI, S. KANEMATSU, AND T. GOMI, IEEE BCTM TECH. DIG., 1996, PP. 185–188.

[2] "PROCESS HJ: A 30GHz NPN AND 20GHz PNP COMPLEMENTARY BIPOLAR PROCESS FOR HIGH LINEARITY RF CIRCUITS," M.C. WILSON, P.H. OSBORNE, S. NIGRIN, S.B. GOODY, J. GREEN, S.J. HARRINGTON, T. COOK, S. THOMAS, A.J. MANSON, AND A. MADNI, IEEE BCTM TECH. DIG., 1998, PP. 164–167

FINAL SIMS PROFILE OF HEICBiC PROCESS COMPARED TO EPITAXIAL COLLECTOR PROCESS

HIGH ENERGY IMPLANTED BURIED LAYER AND ISOLATION (HEICBiC PROCESS)

VERTICAL PNP BIPOLAR TRANSISTOR AND ITS METHOD OF FABRICATION

BACKGROUND OF THE INVENTION

1. Field of the Invention

The present invention relates to a vertical PNP bipolar transistor and its method of fabrication. More particularly, it relates to a vertical PNP transistor fabricated without an epitaxial silicon layer therein.

2. Description of the Prior Art

Generally there are two types of bipolar transistors, i.e. a lateral bipolar transistor and a vertical bipolar transistor. In the lateral bipolar transistor, the current flows around a surface of the transistor, while in a vertical bipolar transistor the current flow is perpendicular to the plane of the substrate.

An example of a typical prior art vertical PNP bipolar transistor can be found with reference to U.S. Pat. No. 5,677,209 issued to Shon et al, incorporated herein by reference. This transistor is shown with reference to FIG. 1. Referring to FIG. 1, the vertical PNP transistor has a P-type semiconductor substrate 11. An N-type buried layer 13 is formed on an upper portion of the P-type substrate 11. A P-type epitaxial layer 15 which functions as a collector region is grown on the P-type substrate 11 having N-type buried layer 13 on a surface portion thereof. An N-type sink 16 is formed in epitaxial layer 15 from the surface of the epitaxial layer 16 to N-type buried layer 13 so that the N-type sink 16 overlaps (or contacts) N-type buried layer 13 to separate the elements of the vertical transistor in the horizontal direction by defining a P-type well 17 in epitaxial layer 15. A base mask 19 is formed with an opening 21 to expose a portion of P-type well 17 on the surface of epitaxial layer 15. A P-type collector enhancement region 23 is formed above N-type buried layer 13 by implanting a dopant through opening 21 of base mask 19. An N-type base region 25 is formed above collector enhancement region 23 by implanting a dopant through opening 21 of base mask 19. A polysilicon emitter contact region 27 is formed on a portion of base region 25. A P-type emitter region 29 is formed under emitter contact region 27 and at an upper portion of base region 25 by diffusing the dopant from emitter contact region 27. An N-type base contact region 31 is formed at another upper portion of base region 25, and a plurality of collector contact regions 33 and 34 are formed at surface portions of P-type well 17 except the portion where base region 25 is formed.

While there have been many variations of vertical PNP transistors, they all have had one thing in common. That is, all of the prior art transistors of this type have required the use of an epitaxially grown layer in their fabrication, usually an epitaxial N-type isolation layer.

Wireless communication circuits continue to progress toward higher speed and higher integration in an effort to reduce cost and increase performance. However, processing technology must be developed to address this need for high speed with low power and low cost devices. One approach to the problem is the fabrication of BiCMOS structures. These structures have both bipolar transistors for power or high voltage capabilities, and CMOS devices for digital or logical capabilities. The transistors in a bipolar or BiCMOS process must have a highly conductive P-type collector layer which is isolated from the P-type substrate by an N-type isolation layer. Heretofore, such structures have been achieved utilizing low to medium energy ion implantation followed by the growth of an epitaxial silicon isolation layer. Examples of such structures and processing to achieve them can be found in "A Complementary Bipolar Technology for Low Cost and High Performance Mixed Analog/Digital Applications", H. Miwa et al., IEEE BCTM 11.4 Tech. Digest, 185–188, (1996) and "Process HJ: A 30 GHz NPN and 20 GHz PNP Complementary Bipolar Process for High Linearity RF Circuits", M. C. Wilson et al., IEEE BCTM 9.4 Tech. Digest, 164–167 (1998) incorporated herein by reference.

It would be highly desirable to be able to fabricate such a transistor without the need for epitaxial silicon growth and in a manner that is compatible with the fabrication of the CMOS device. Elimination of the epitaxial processing step should result in low cost devices with high yield and which are relatively easy to manufacture.

SUMMARY OF THE INVENTION

A high performance complementary bipolar vertical PNP transistor especially useful in a CMOS device comprises, a P-type silicon substrate, a PNP-tub, a P-tub adjacent the PNP-tub, said PNP-tub having a p+ collector implanted therein, said PNP-tub having an N-type isolation layer implanted therein and an n+ base and a p+ emitter spaced from the n+ base implanted in the N-type isolation layer, said N-type isolation layer being spaced from the collector in the P-tub and isolated therefrom with a dielectric isolation layer deposited therebetween, the transistor being devoid of any epitaxial layers.

In a preferred embodiment wherein the transistor is integrated with a CMOS device, the transistor further includes a first and a second N-tub adjacent the PNP-tub and P-tub, respectively, each N-tub having a dielectric isolation layer deposited thereover to provide lateral isolation of the PNP transistor from adjacent CMOS devices.

A key to the formation of the high performance bipolar vertical PNP transistor of the present invention is the step of providing a substrate isolation layer of the transistor by High energy phosphorus ion implantation rather than the formation of an N-type epitaxially grown layer.

BRIEF DESCRIPTION OF THE DRAWINGS

FIGS. 2–17 are sequential sectional views showing the various processing steps for fabricating a complementary BiMOS device incorporating a bipolar vertical PNP transistor in accordance with the present invention. The device is referred to as a High-Energy Implanted Complementary Bipolar CMOS (HEICBiC) device.

FIG. 18 is a Table comparing parameters of HEICBiC processed devices with devices formed by other complementary Bipolar/BiCMOS processing.

FIG. 19 is a table setting forth the typical variation of electrical parameters for HEICBiC processed devices.

DETAILED DESCRIPTION OF THE INVENTION

A high performance complementary bipolar vertical PNP transistor especially useful in a CMOS device comprises a P-type silicon substrate, a PNP-tub and a P-tub adjacent the PNP-tub. The PNP-tub has a high energy implanted p+ collector therein, a high energy implanted N-type isolation layer therein, and a low energy n+ base and a p+ emitter spaced from the n+ base implanted in the N-type isolation layer, said N-type isolation layer being spaced from the collector in the P-tub and isolated therefrom with a dielectric isolation layer deposited therebetween, the transistor being devoid of any epitaxial layers.

In a preferred embodiment wherein the transistor is integrated with a CMOS device, the transistor further includes a first and a second N-tub adjacent the PNP-tub and P-tub, respectively, each N-tub having a dielectric isolation layer deposited thereover to provide lateral isolation of the PNP transistor from adjacent CMOS devices.

A key to the formation of the high performance bipolar vertical PNP transistor of The present invention is the step of providing a substrate isolation layer of the transistor by High energy phosphorus ion implantation rather than the formation of an N-type epitaxially grown layer.

Figure 1:
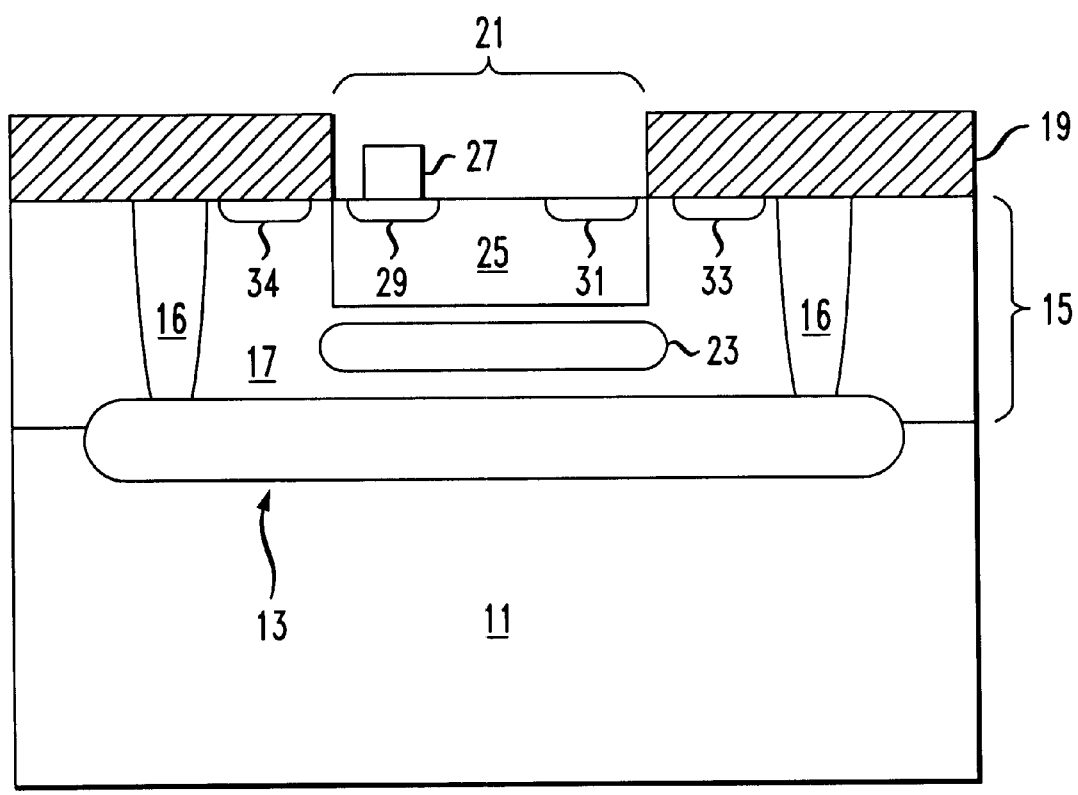
FIG. 1 is a sectional view of a prior art vertical PNP transistor.
Figure 4:
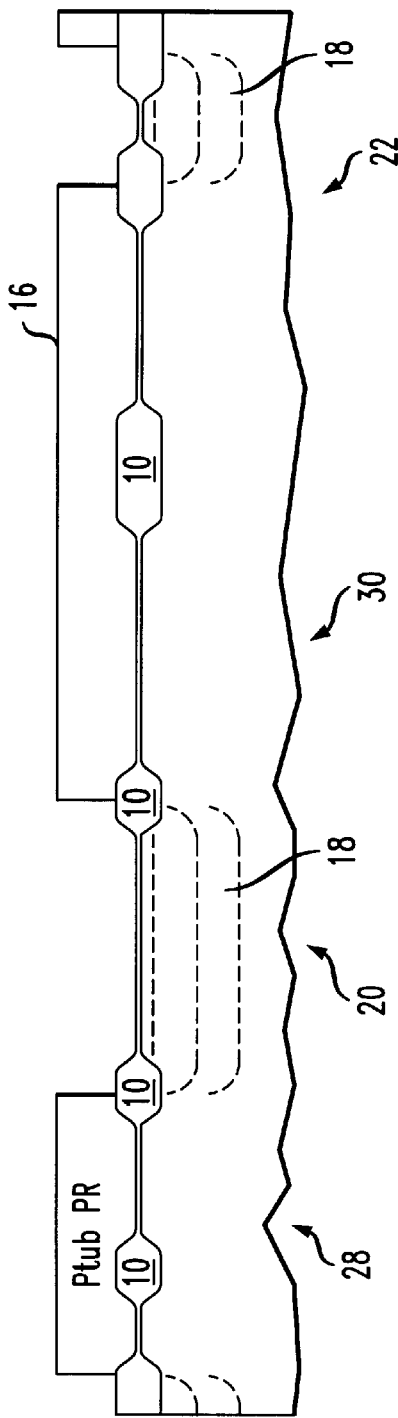
Figure 5:
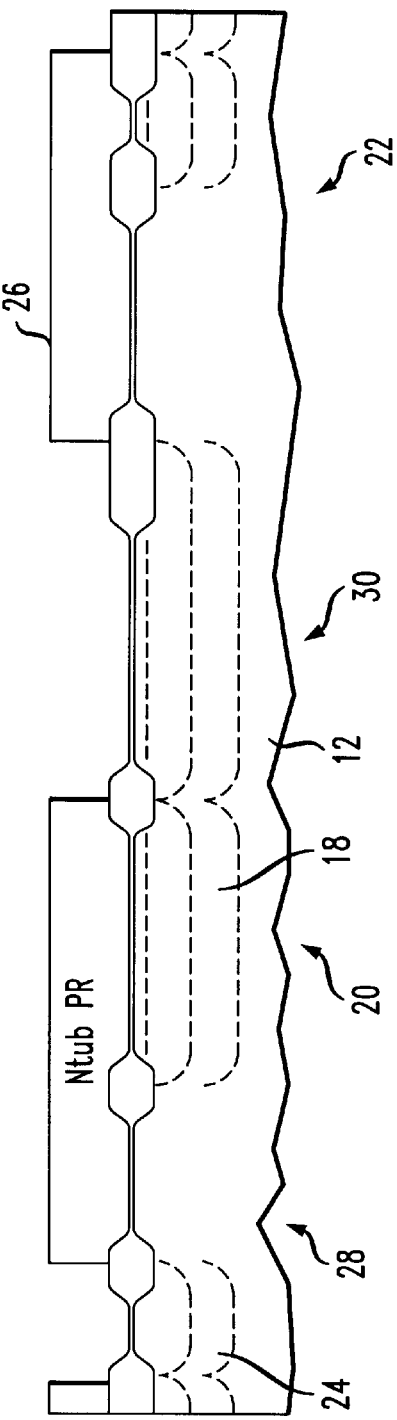
Figure 6:
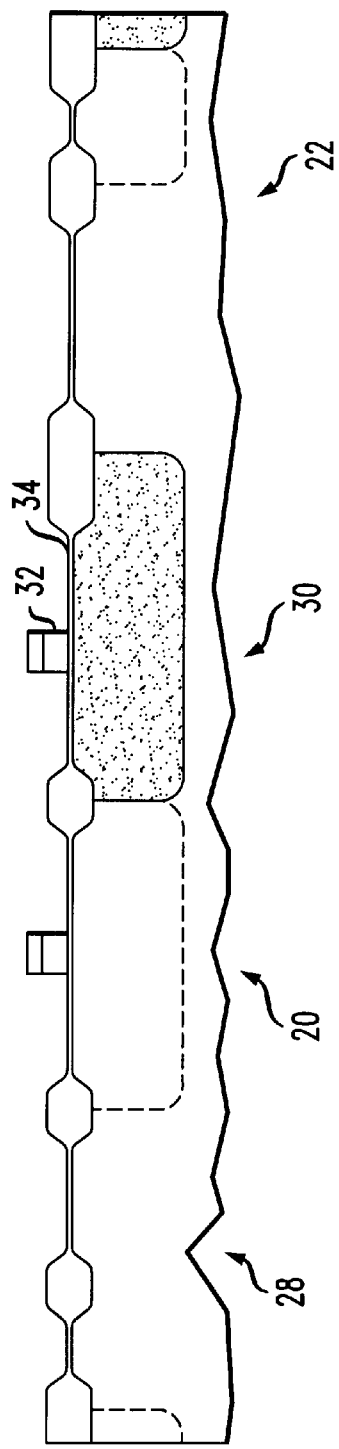
Figure 7:
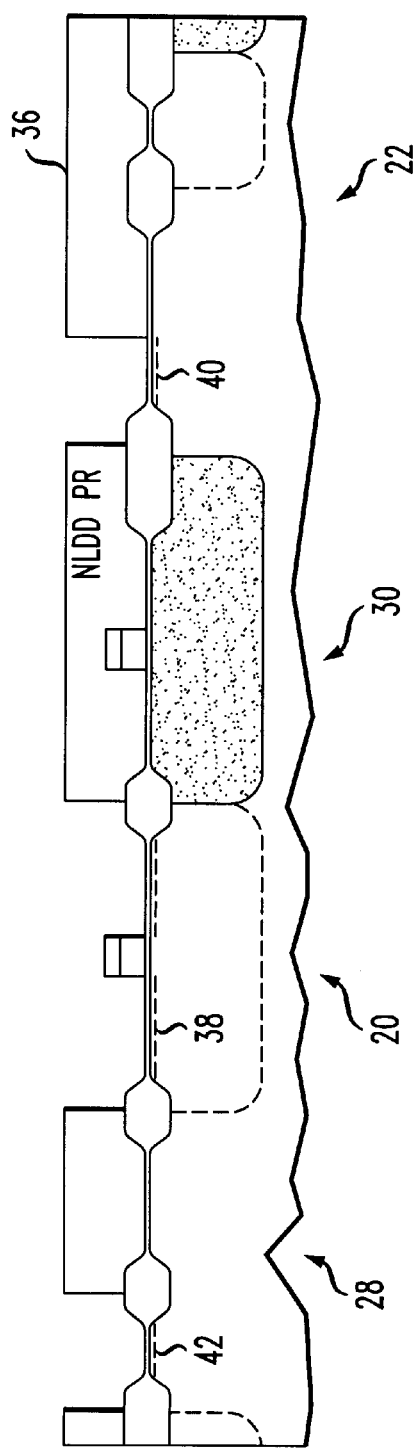
Figure 8:
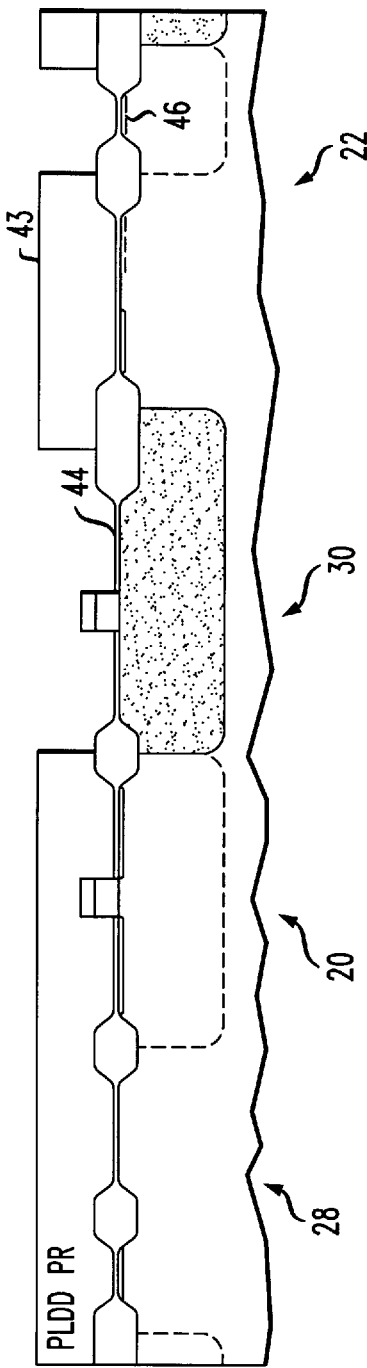
Figure 9:
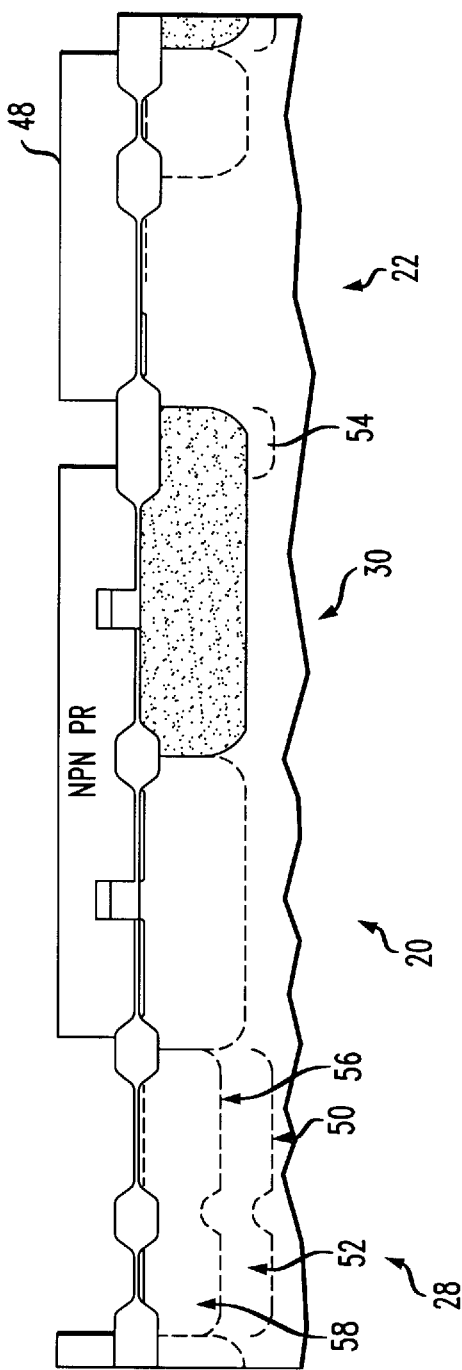

The above described vertical PNP transistor in a complementary BiCMOS structure which includes an NPN, a NMOS, a PMOS and a PNP transistor may be fabricated as follows with reference to FIGS. 2–17. It should be noted that the individual processing steps referred to herein are well known in the art and need not be described in detail Spaced isolation layers 10 (typically LOCOS or shallow trench) are formed on the surface of a P-type silicon substrate 12 utilizing a first mask 14 (FIGS. 2 and 3). These isolation layers 10 are used for isolation between emitter/base and collector in the PNP transistor as well as isolation between devices. Utilizing a second mask 16, P-tubs 18 are simultaneously implanted for the NMOS 20, and PNP devices 22 (FIG. 4). N-tubs 24 are then simultaneously implanted through a third mask 26 for the NPN 28 and PMOS 30 devices (FIG. 5). They also provide for lateral isolation in the PNP transistor. The P-tubs and N-tubs are formed by high-energy ion implantation. This is followed by NMOS and PMOS gate oxidation, and through a fourth mask (not shown) which is preferably an oxide hard-mask with dielectric antireflection coating, a gate poly WSi 32 is deposited followed by a poly etch (FIG. 6). Typically the gate oxide 34 is grown to about 50 A. Through a fifth mask 36, N-type lightly doped drain (LLD) implants 42, 38 are simultaneously provided for the NPN 28 and NMOS 20 devices, respectively, and as a base contact are 40 of the PNP 22 (FIG. 7). Preferably, two NLDD implants are used to optimize the NMOS transistors for either 3.3V or 2.5V operation. Through a sixth mask 43, P-type LDD implants 44 are simultaneously provided for PMOS device 30 and as a collector contact 46 of the PNP device 22 (FIG. 8). Through a seventh mask 48, a high-energy phosphorus implant 50 provides the NPN collector 52 and deep lateral isolation 54 in the PNP transistor 22 followed by a low energy boron implant 56 (as BF2) for providing the NPN base 58 (FIG. 9). Through an eighth mask 60 a high-energy phosphorous implant 62 completes the isolation layer 63 of the PNP 22. This is followed by a high-energy boron implant 64 to provide the PNP collector 66 and then a low energy phosphorus implant 68 to provide the PNP base 70 (FIG. 10). After removal of the eighth mask 60 a spacer oxide layer 72 is formed over the entire BiMOS device surface and NPN emitter window 74 is formed by etching through a ninth mask 76 (FIG. 11). After removal of the ninth mask 76, an emitter polysilicon deposition 78 is provided over the surface of the entire device followed by an emitter polysilicon implant (FIG. 12). Generally, the high energy phosphorus implants are carried out at least about 1 MEV. Medium energy phosphorus implants are generally carried out in about 0.1 MEV to 1 MEV range, while low energy phosphorus implants are carried out in the range of from several keV to 0.1 MEV. Boron implantation generally requires about half the energy of phosphorus implantation to achieve the same depth.

Figure 14:
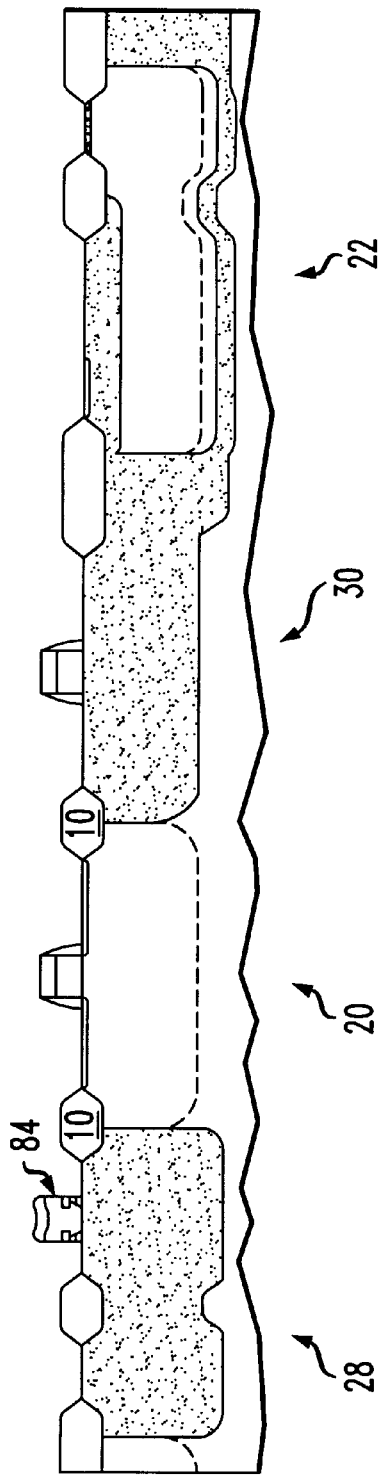
Figure 15:
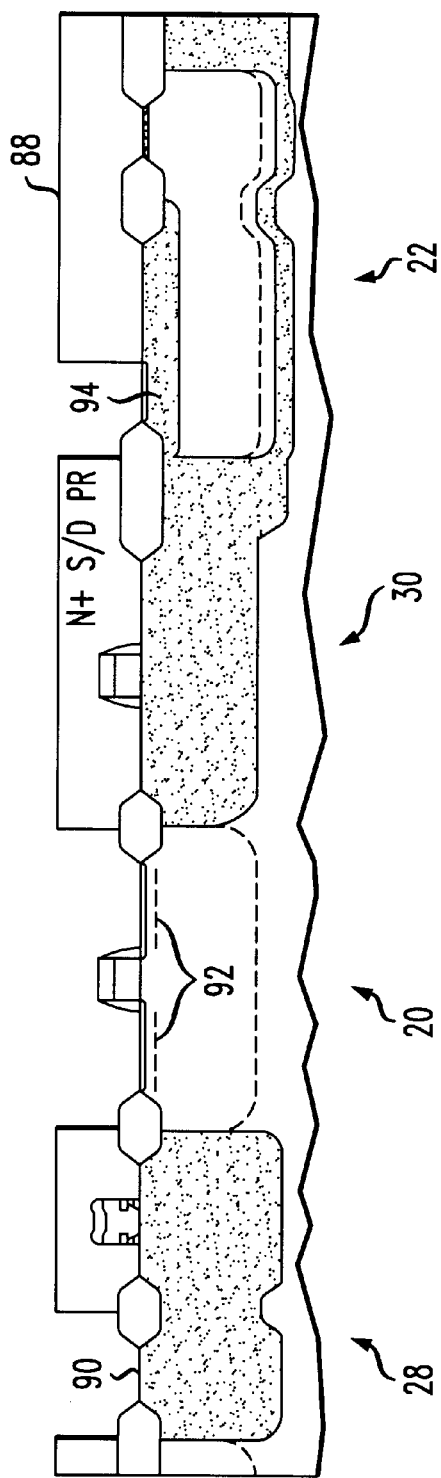

A single-poly self aligned emitter process is used for the NPN transistor 28. A NPN emitter polysilicon layer 80 and mask 82 are provided over the device (FIG. 13). Arsenic is implanted into the NPN emitter poly and the silicon portion of the emitter is formed by out-diffusion. The surface of the device is then etched down to the level of the earlier formed spaced isolation layers 10 leaving only the polysilicon emitters 84 and the spaced isolation layers 10 above the surface of the substrate 12 (FIG. 14). An eleventh mask 88 is then provided for N+ implantation of the NPN collector contact 90, the NMOS source and drain 92 and the base contact 94 of the PNP 22 (FIG. 15). A twelfth mask 96 is then provided for defining the regions for P+ base contact 98 for the NPN device 28 and source and drain 100 of the PMOS device 30 and emitter 102 and collector 104 of the PNP device 22 (FIGS. 16 & 17). Thereafter, conventional processing may be collected for device metalization and encapsulation.

It should be noted that the back-end portion of the process is identical to the core CMOS process, details of which can be found with reference to an article by I. C. Kizilyalli, et al. To appear in Custom Integrated Circuits Conf., 1998 and incorporated herein by reference.

As compared with CMOS processing, only one extra mask is required to provide the PNP transistor in conjunction with the CMOS devices while three extra masks are required to provide the NPN device in the structure.

Typical device characteristics of a novel 0.25 micron HEICBiC device are shown below. All electrical data was measured at 25 C., unless otherwise noted.

| Bipolar | NPN | PNP |
|---|---|---|
| $A_E$ ($\mu m2$) | 0.4 × 1.2 | 0.8 × 2.4 |
| $f_t$ at $V_{CE}$ = 3.3V | 38.3 GHz | 10.7 GHz |
| $f_{max}$ at $V_{CE}$ = 3.3V | 29.4 GHz | 11.8 GHz |
| β | 109 | 42 |
| $V_A$ | 25.4 V | 10.2 V |
| $BV_{CEO}$ | 4.5 V | 8.0 V |
| $BV_{CBO}$ | 8.8 V | 9.7 V |
| $BV_{EBO}$ | 6.5 V | 6.8 V |
| $BV_{CSO}$ | 12.6 V | 7.5 V |
| CMOS | 3.3 V | 2.5 V |
| $T_{ox}$ | 5.0 nm | 5.0 nm |
| $L_{poly}$(NMOS) | 0.32 $\mu m$ | 0.24 $\mu m$ |
| $L_{poly}$(PMOS) | 0.28 $\mu m$ | 0.28 $\mu m$ |
| $V_{TH}$(NMOS) | 0.55 V | 0.55 V |
| $V_{TH}$(PMOS) | 0.90 V | 0.85 V |
| $I_{ON}$(NMOS) | 700 A/$\mu m$ | 570 A/$\mu m$ |
| $I_{ON}$(PMOS) | 400 A/$\mu m$ | 230 A/$\mu m$ |
| $I_{OFF}$ at 125° C. | <1 nA/$\mu m$ | <1 nA/$\mu m$ |
| S(NMOS) | 80 mV/dec | 80 mV/dec |
| S(PMOS) | 90 mV/dec | 90 mV/dec |

Both NPN and PNP transistors exhibit nearly ideal 60 mV/decade slopes for the collector and base currents down to the pico-amp level. Also test results show the current gain to be constant over five decades of collector current for both NPN and PNP devices. The substrate current during normal PNP device operation is near the pico-amp level, indicating excellent isolation between the collector and p-type substrate.

S-parameter measurements were performed up to 40 GHz using a HP8510 network analyzer to evaluate the high frequency performance of the NPN and PNP transistors. It was found that the current gain exhibits close to an ideal single-pole decrease of 20 dB/decade for both the NPN and PNP transistors. The unilateral power gain has a somewhat larger slope of 25 dB/decade. The calculated peak cutoff frequencies at $V_{CE}$=3.3V are 38.3 GHz for the NPN transistor and 10.7 GHz for the PNP transistor. The calculated maximum oscillation frequencies at 3.3V are 29.4 GHz for the NPN transistor and 11.8 GHz for the PNP transistor. At $V_{CE}$=1V the respective values of peak cutoff frequency is 34.3 GHz and 7.3 GHz and the respective values of the maximum oscillation frequencies are 24.2 GHz and 8.2 GHz. These values show excellent low voltage capability of devices fabricated with the process of this invention. It has also been shown that the devices require low current densities for peak high frequency performance that is also important in low-power wireless designs.

Referring to FIG. 18, there is shown a comparison of various parameters for HEICBiC processed devices to other complementary bipolar/BiCMOS processed devices. As can be seen from the table, the overall characteristics of the device of the present invention compare favorably with the prior art devices. Also, as can be seen with reference to FIG. 19, the variation in device parameters for devices formed by processing in accordance with this invention is well within acceptable manufacturing requirements.

Figure 20A:
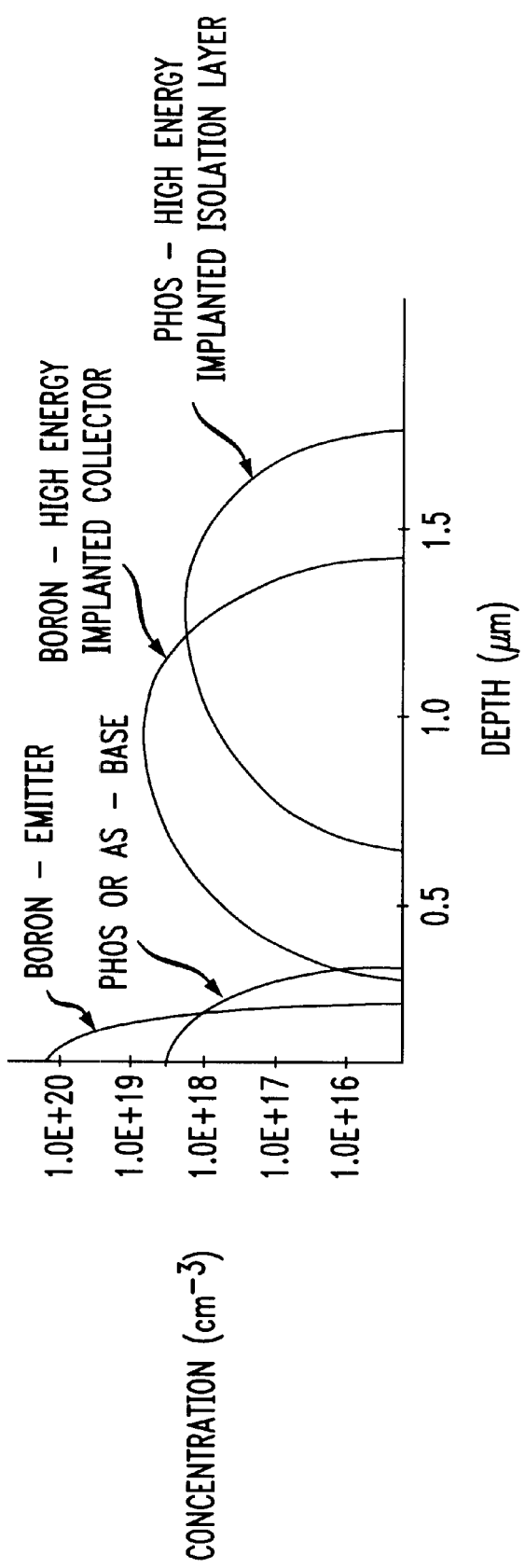
FIGS. 20A and 20B final SIMS profiles of HEICBiC processed devises (FIG. 20A) compared with epitaxial collector processed devices (FIG. 20B). The plots show dopant concentration as a function of depth of dopant for the emitter, base, collector and isolation layer regions of the respective devices.
Figure 20B:
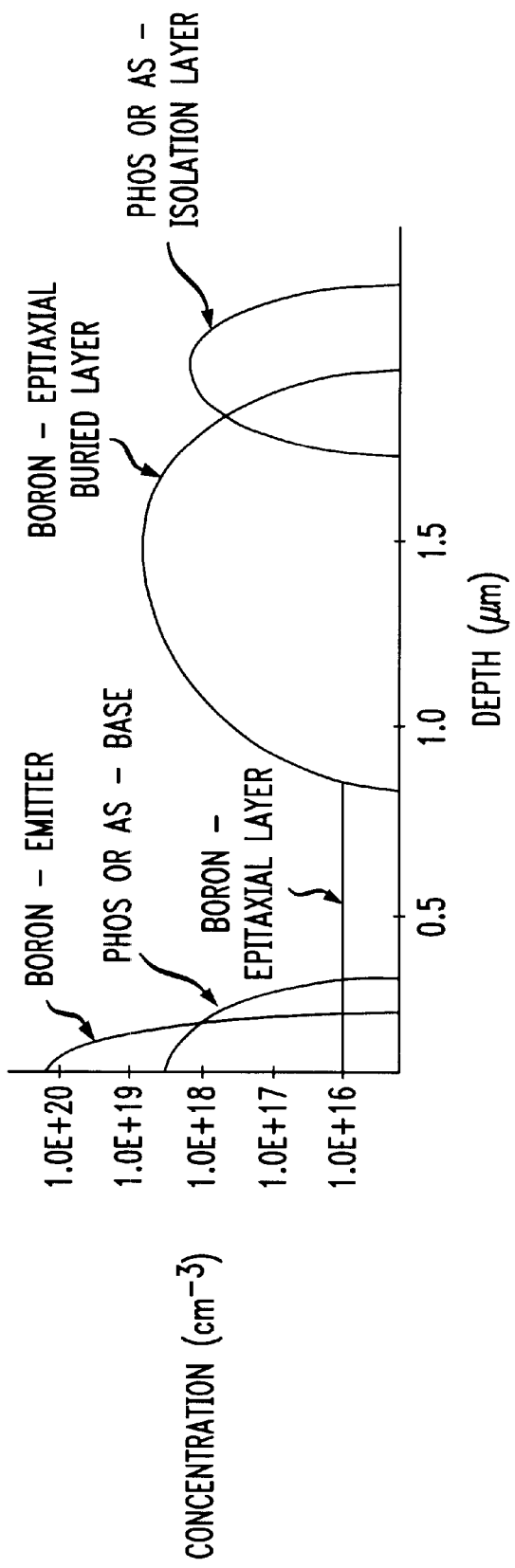

Referring to FIGS. 20A and 20B, it can be seen that the dopant concentration and depth of the emitter and base for the two processes are equivalent. However, the Boron high energy collector and the phosphorus high-energy implanted isolation layer of the present device is characterized by a much shallower depth than the corresponding boron epitaxial buried layer and phosphorus or arsenic isolation layer of the prior art device. In fact, the peak concentration of the isolation layer dopant is typically at a depth of approximately 1 micron and that of the high energy boron doped collector is less than 1 micron. These differences in dopant depth are essentially due to the presence of the boron epitaxial layer of the prior art processed device. This characteristic of the present device has the advantage of reducing the hole drift time in the collector, which improves the cutoff frequency. Typical peak concentrations of phosphorus in the isolation layer are from about 1E+17 to 1E+18/cm³. Typical peak concentrations of boron in the collector are in the neighborhood of 1E+18/cm³ or higher. It should be understood that the invention is not limited to these concentrations and the concentrations can be varied even outside the typical ranges given and depend upon desired final device characteristics.

While the vertical PNP transistor of this invention is described in conjunction with processing steps need to form other devices in a complementary BiMOS structure, it will be appreciated that one could fabricate the novel devices independently of any of the complementary devices of the structure by deleting the fabrication steps associated with one or more of the other devices. It should also be recognized that while the embodiment described utilizes compounds or elements commonly employed in today's technology as dopants, isolation layer and the like, it is possible to substitute other materials which function in the same manner for the preferred materials of today's technology.

What we claim is:

1. A bipolar vertical PNP transistor, comprising:
   an implanted N-type isolation layer located in a non-epitaxially grown P-type silicon substrate;
   a p+ collector located in the P-type silicon substrate and over the N-type isolation layer;
   an n+ base located in the p+ collector; and
   a p+ emitter located in the n+ base.

2. The bipolar vertical PNP transistor as recited in claim 1 further including a deep lateral isolation region contacting the implanted N-type isolation layer and located under an isolation layer.

3. The bipolar vertical PNP transistor as recited in claim 1 wherein the implanted N-type isolation layer has a peak dopant concentration at a depth of about 1 micron.

4. The bipolar vertical PNP transistor as recited in claim 1 wherein the implanted N-type isolation layer is an implanted phosphorous isolation layer.

5. The bipolar vertical PNP transistor as recited in claim 4 wherein the implanted phosphorous isolation layer has a peak phosphorous concentration ranging from about 1E17 atoms/cm³ to about 1E18 atoms/cm³.

6. The bipolar vertical PNP transistor as recited in claim 1 further including PMOS transistors, NMOS transistors and NPN transistors located adjacent to the bipolar vertical PNP transistor to form a complementary BiCMOS device.

* * * * *